United States Patent [19]

Perlegos et al.

[11] 4,264,828
[45] Apr. 28, 1981

[54] MOS STATIC DECODING CIRCUIT

[75] Inventors: George Perlegos, Cupertino; Saroj Pathak, Campbell, both of Calif.

[73] Assignee: Intel Corporation, Santa Clara, Calif.

[21] Appl. No.: 963,973

[22] Filed: Nov. 27, 1978

[51] Int. Cl.³ ................ H03K 19/094; H03K 19/017; G11C 8/00

[52] U.S. Cl. .................................... 307/463; 307/475; 365/230

[58] Field of Search ................. 307/205, DIG. 5, 270; 365/230, 231

[56] References Cited

U.S. PATENT DOCUMENTS

| | | | |
|---|---|---|---|
| 3,863,230 | 1/1975 | Regitz et al. | 307/DIG. 5 X |
| 3,964,030 | 6/1976 | Koo | 307/DIG. 5 X |
| 4,079,462 | 3/1978 | Koo | 307/DIG. 5 X |
| 4,095,282 | 6/1978 | Oehler | 307/DIG. 5 X |
| 4,096,584 | 6/1978 | Owen et al. | 307/DIG. 5 X |
| 4,124,900 | 11/1978 | Smith et al. | 307/DIG. 5 X |

OTHER PUBLICATIONS

Radzik, "Multiple Image Read-Only Storage," *IBM Tech. Discl. Bull.*; vol. 14, No. 12, pp. 3737–3738, 5/72.
Masuhara et al., *IEEE Journal of Solid-State Circuits*, vol. SC-7, No. 3, pp. 224–231, 6/72.

*Primary Examiner*—Larry N. Anagnos
*Attorney, Agent, or Firm*—Blakely, Sokoloff, Taylor & Zafman

[57] ABSTRACT

A metal-oxide-semiconductor (MOS) static decoding circuit for selecting an addressed line in a high density memory array, or the like, is disclosed. The circuit may be laid-out along array lines where the lines have a pitch of approximately 12.25 microns. Three levels of decoding are employed. The highest level permits the pulling-up of a common node in the second level decoder. The third level of decoding selects one of a plurality of array lines coupled to this node. Zero threshold voltage MOS devices are employed for coupling the first and third decoders to the second decoder.

10 Claims, 3 Drawing Figures

MOS STATIC DECODING CIRCUIT

BACKGROUND OF THE INVENTION

1. Field of the Invention

The invention relates to the field of decoders, particularly MOS decoders for integrated circuits.

2. Prior Art

In the field of MOS integrated circuits there is a continuing effort to increase circuit densities. Higher densities result in lower cost memories, and the like, since yield is much more a function of substrate area than circuit density per unit area.

In recent years memory cell sizes (substrate area per cell) have been greatly reduced, including memory cells for static and dynamic random-access memories and programmable and mask programmed read-only memories. Often in these memories the cells are arranged along row lines (word lines) in an array with row decoders disposed along the ends of these lines or bisecting these lines. For this convenient layout, the row decoders must be sufficiently small to be laid-out with the row lines. For example, if the pitch of the cells (center-to-center distance) is 15 microns, than each decoder should be no more than 15 microns for the dimension perpendicular to these lines. Otherwise, the advantage gained from the smaller cells would be lost. Thus, to provide high density memories, decoders with a relatively small dimension (perpendicular to the row lines) are necessary. These decoders, of course, must be consistent with the power requirements and speed requirements of the memory.

The closest prior art decoder known to the applicant is shown in U.S. Pat. No. 4,096,584 (FIG. 4). (The memory disclosed in this patent is also described in "Speedy RAM Runs Cool With Power-Down Circuitry," *Electronics*, Aug. 4, 1977, Page 103. )This decoder employs a zero threshold voltage device for powering down the decoder. This prior art decoder provides a pitch of approximately 55 microns (12 mil. width). When the chip is enabled a substantial current drain occurs, however, with these decoders since the "pull-up" circuits in each decoder is activated.

The decoding circuit of the present invention provides a smaller decoder than that described in U.S. Pat. No. 4,096,584. Moreover, because of the third level of decoding, the decoding circuits (in toto) consume considerably less power.

SUMMARY OF THE INVENTION

An MOS static decoding circuit is described. A first decoding means receives first address signals and provides a signal when these address signals are in a predetermined state. A field-effect device having a threshold voltage of approximately zero volts is coupled between a source of potential and a common node; the gate of this device is coupled to receive the signal from the first decoding means. A second decoding means which is coupled to the common node receives a plurality of second address signals. The second decoding means permits the common node to rise in potential when the second address signals are in a predetermined state. In this manner memory cells which are coupled to this common node receive a potential when the first and second address signals are in predetermined states.

DETAILED DESCRIPTION OF THE INVENTION

An MOS static decoding circuit particularly useful in a memory such as a random-access memory or read-only memory is described. In the following description numerous specific details such as specific dimensions are given in order to provide a thorough understanding of the present invention. However, it will be obvious to one skilled in the art, that the invention may be practiced without these specific details. In other instances well-known circuits and processes have not been described in detail in order not to obscure the present invention in unneccessary detail.

Figure 1:
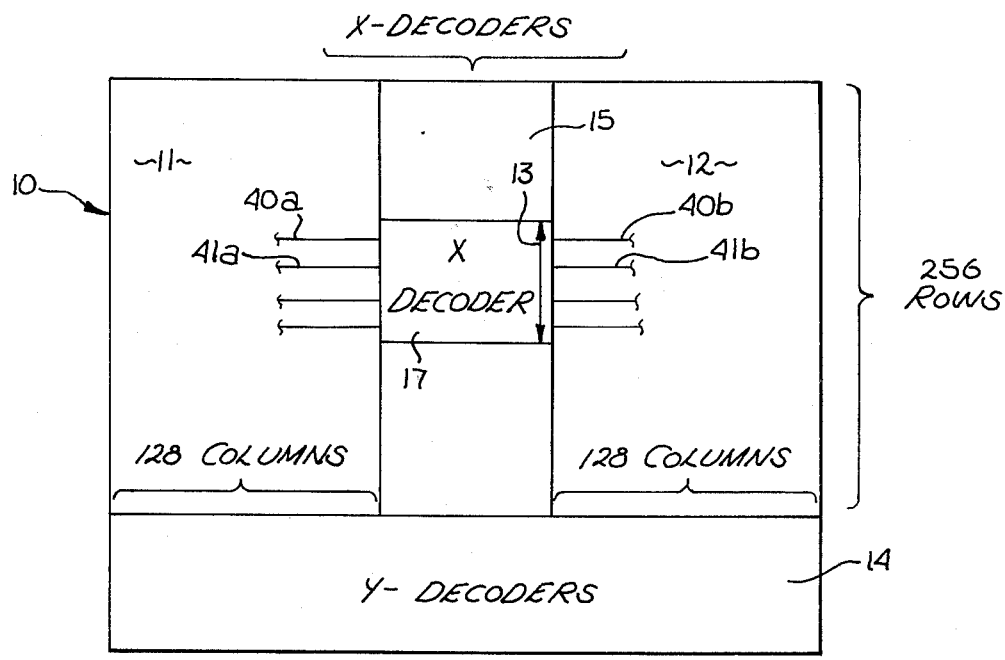
FIG. 1 is a block diagram illustrating the general layout of a memory employing decoding circuits of the present invention.

Referring now to FIG. 1, a commonly employed layout for a RAM or ROM is illustrated. The memory cells of the memory 10 are divided into two arrays 11 and 12. For the 64K memory illustrated, each array includes 128 column lines and 256 row lines. A memory cell (a read-only memory cell, in the presently realized embodiment) is disposed at the intersection of each of the column lines and row lines. Decoders 14 are employed to select column lines. The X-decoders separate the arrays and are disposed in the general area 15. One X-decoder 17 is illustrated in FIG. 1.

The requirement for X-decoders having a relatively small dimension 13 can immediately be appreciated from FIG. 1. To provide a dense memory the row lines such as lines 40a/40b and 41a/41b are as closely spaced as possible. This spacing is determined by the dimension of the cells, specifically the dimension perpendicular to the row lines. The X-decoders must be designed so that they have a pitch approximately equal to, or less than, that of the row lines. Otherwise, the advantage of the smaller cells is lost. The same problem occurs when the decoders are disposed at the end of the row lines. The same problem is also encountered in the Y-direction in some memories, particularly where a single bit is selected in the memory rather than a word.

In the presently preferred embodiment, as will be described, each of the decoding circuits such as the one shown in FIG. 1 as X-decoder 17 (shown in detail in FIG. 3) has four bisected row lines coupled to it. Thus by way of example, the X-decoder 17 of FIG. 1 may select the row line 40a/40b or the line 41a/41b and so on.

Figure 2:
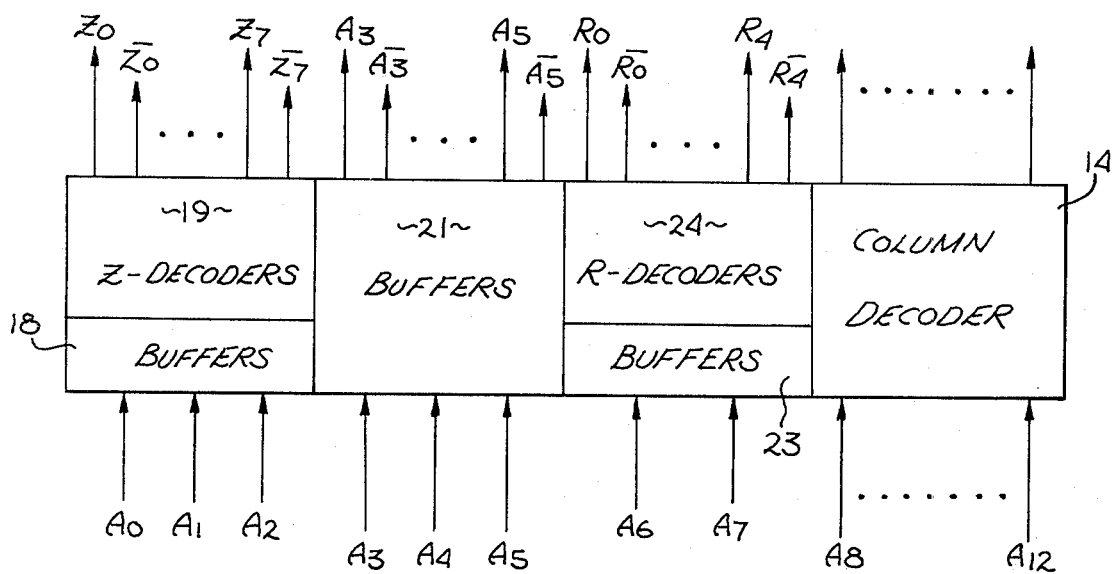
FIG. 2 is a block diagram illustrating the various address buffers and some of the decoders employed in the memory of FIG. 1.

In its presently realized embodiment, the memory of FIG. 1 is addressed with a thirteen bit address shown as $A_0$–$A_{12}$ in FIG. 2. The address signals $A_0$–$A_7$ are employed to select one of the 256 rows in the memory. The address signals $A_8$–$A_{12}$ are employed to select eight column lines, thus for each address an eight bit word is selected.

The address signals $A_0$–$A_2$ are coupled to buffers 18 where they are buffered in an ordinary manner. Commonly employed decoders identified as Z-decoders 19 are used to fully decode the signals $A_0$–$A_2$ to provide the eight possible binary signals and their complements.

As will be described in greater detail in conjunction with FIG. 3, the signals $Z_0$-$Z_7$ and their complements are employed for the first level of decoding.

The address signals $A_3$-$A_5$ are coupled to buffers 21 which in addition to providing buffering also provide complementary address signals $\overline{A}_3$, $\overline{A}_4$ and $\overline{A}_5$. For the sake of convenience the buffered address signals are identified in the same manner as the externally applied address signals. The address signals $A_3$-$A_5$ and their complements are employed by the second level of decoding, as will be described.

The address signals $A_6$ and $A_7$, after being buffered by buffers 23 are fully decoded by ordinary decoders 24 to provide the signals $R_0$-$R_4$ and their complements. These signals are used for the third level of decoding.

In the presently preferred embodiment, the entire memory (including the decoding circuit of the present invention) is fabricated employing metal-oxide-semiconductor (MOS) technology. More specifically, n-channel silicon gate technology is employed. The specific processing used for fabricating the memory results in four different transistor-types; each of these types has a different threshold voltage. This process which is disclosed in U.S. Pat. No. 4,052,229 employs a high resistivity p-type silicon substrate (50 ohm-cm) resulting in high mobility devices with low body effect.

One transistor-type employed in the memory is an enhancement mode transistor having a threshold voltage of approximately +0.6 to +0.9 volts. This transistor is illustrated in FIG. 3 by the standard field-effect symbol, such as transistors 34, 35 and 36. The second transistor-type employed in the memory is a depletion mode transistor having a threshold voltage of approximately −2.5 to −3.5 volts. The symbol designation used in FIG. 3 for this type transistor is shown by transistor 32. The third transistor-type which results from this process is a "weak" depletion mode device having a threshold voltage between −1.2 to −1.8 volts; this device is not employed in the present invention. The last transistor-type has a threshold voltage approximately equal to zero volts. In typical fabrication the threshold voltages of these devices range between −0.30 to +0.20 volts. This device is referred to in this application as a "zero" threshold transistor or device since its threshold voltage is approximately zero volts. The symbol employed for this device includes a small zero under the gate as shown in FIG. 3 by devices 45 and 47.

In the presently preferred embodiment, the channel regions of the zero threshold devices employ the substrate without any further doping. In contrast, the channel regions for the depletion mode transistors are arsenic implanted to a dopant level of approximately $0.8 \times 10^{12}/cm^2$. The threshold voltage for the enhancement mode transistors is obtained by employing a boron dopant in the channel regions of these transistors; a dopant level of approximately $0.4 \times 10^{12}/cm^2$ is used.

Figure 3:
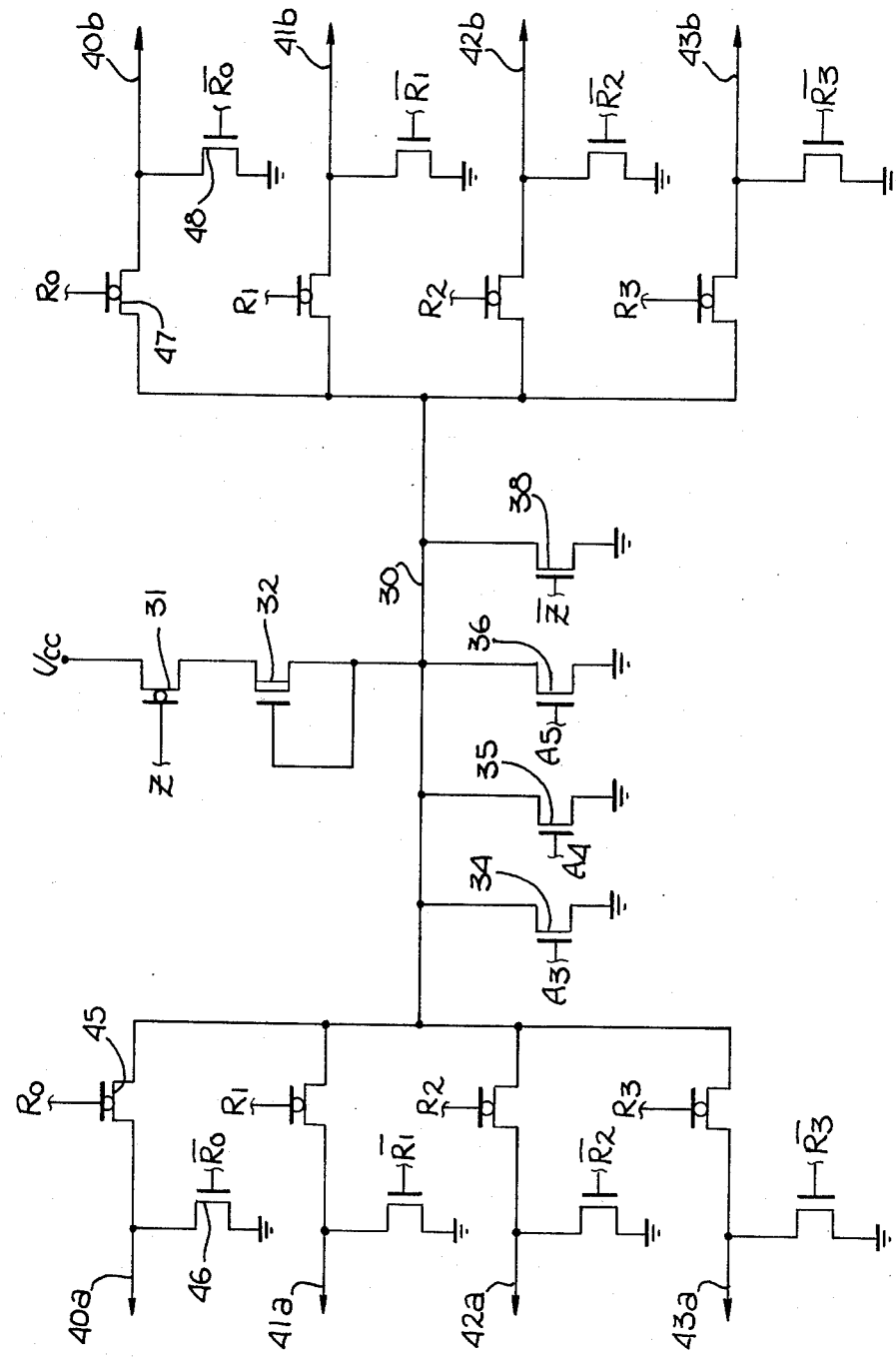
FIG. 3 is a circuit diagram illustrating the presently preferred embodiment of the invented decoding circuit.

Referring now to FIG. 3, one of the 64 X-decoding circuits used in the memory of FIG. 1, such as decoder 13, is shown in detail. These circuits each use three levels of decoding for the presently preferred embodiment. The first level of decoding is used to couple the common node 30 to the potential $V_{cc}$. The second level of decoding causes the common node 30 to remain charged and the third level of decoding selects one of the four row lines coupled to the decoder (lines 40a/40b, 41a/41b, 42a/42b and 43a/43b). The first level of decoding includes the Z-decoders 19 (FIG. 2). Each of the Z outputs (non-complementary) is coupled to eight decoding circuits (each of which is identical to the circuit of FIG. 3) for the memory of FIG. 1. The Z signal is coupled to the gate of the zero threshold transistor 31. The drain terminal of this transistor is coupled to a source of positive potential $V_{cc}$ and the source terminal of the device is coupled to the drain terminal of a depletion mode transistor 32. The source terminal of transistor 32 is coupled to the common node 30 as is the gate of this transistor.

The second level of decoding consists of three enhancement mode transistors for the presently preferred embodiment each of which is coupled between the common node 30 and ground. These transistors are shown in FIG. 3 as transistors 34, 35 and 36 and, by way of example, receive the address signals $A_3$, $A_4$ and $A_5$. As will be appreciated, the decoding circuits employ a different combination of the address signals $A_3$-$A_5$ and their complements. (For the memory of FIG. 1 each possible combination of these address signals is coupled to eight decoding circuits.) The complement of the Z address signal applied to the gate of transistor 31 is applied to the gate of the enhancement mode transistor 38. Transistor 38 is coupled between the node 30 and ground to assure that the node 30 is coupled to ground when the transistor 31 is not selected.

The common node 30 is coupled to the row lines in the array through zero threshold voltage transistors. For example, node 30 is coupled to line segment 40b through the terminals of transistor 47. The gate of transistor 47 receives the $R_0$ decoded address signal. The line segment 40b is coupled to ground through the transistor 48. The gate of this transistor receives the complement signal, $\overline{R}_0$. Similarly, the other segment of the line 40, line segment 40a, is coupled to node 30 through a zero threshold transistor 45, the gate of which receives the $R_0$ signal. Also the line segment 40a is coupled to ground through transistor 46; the gate of this transistor receives the $\overline{R}_0$ signal. In a similar manner, each of the lines 41a/41b, 42a/42b and 43a/43b are coupled to the common node 30 through a zero threshold voltage device and are coupled to ground through an enhancement mode transistor. The signals $R_1$-$R_3$ and their complements are coupled to these transistors.

Referring to the address signals $A_0$, $A_1$ and $A_2$ for each predetermined combination of these address signals one of the Z outputs, $Z_0$-$Z_7$ will be a binary one. If the transistor 31 of FIG. 3 has been selected, node 30 will be charged to $V_{cc}$. The depletion mode transistor 32 assures that the node 30 is pulled to $V_{cc}$ less the voltage threshold of transistor 31 which is substantially zero. Note that for the memory of FIG. 1, eight nodes 30 coupled to $V_{cc}$ since each Z signal is coupled to eight decoding circuits.

For a predetermined combination of address signals of $A_3$-$A_5$ the transistors 34, 35 and 36 will not conduct, thus preventing node 30 from discharging through these transistors. Note also that if transistor 31 is conducting the transistor 38 will not conduct. Since each possible combination of the signals $A_3$-$A_5$ and their complements are coupled to eight decoding circuits, eight nodes 30 are always decoupled from ground (ignoring for a moment the efforts of transistor 38). However, only one of these nodes will be charged to $V_{cc}$ since one of the eight nodes will be coupled to $V_{cc}$ through transistor 31. Thus for each combination of the address signals $A_0$-$A_5$ only one node 30 is maintained at $V_{cc}$.

For each combination of the address signals $A_6$ and $A_7$ only one of the lines coupled to each of the X-decoders will be selected. Thus assuming that $R_0$ is a positive potential, $R_1$, $R_2$ and $R_3$ will be in their low state. For these conditions the line segments 40a and 40b will be coupled to node 30 through transistors 45 and 47, respectively, and pulled to $V_{cc}$. The lines 41a/41b, 42a/42b and 43a/43b will be coupled to ground since the $\overline{R}_1$, $\overline{R}_2$ and $\overline{R}_3$ signals are positive. Note that once again there is very little voltage drop across the transistors 45 and 47 since the threshold voltage of these devices is approximately zero volts. Thus for every combination of the address signals $A_0$–$A_7$ only one row line in the array is selected.

As mentioned, for each combination of the address signals only eight of the common nodes corresponding to nodes 30 in all the X-decoders used in the memory of FIG. 1 are active at any given time. In the presently preferred embodiment, where the channel of transistor 32 has a length/width ratio of 20/6 and each of the transistors 34, 35 and 36 have a length/width ratio of 40/4.5, a current drain of approximately 7 ma occurs in only seven of these eight decoders and consequently in all of the 64K decoder. This is a relatively low current flow when compared to comparable prior art decoders. In its presently preferred embodiment, the row lines may have a pitch of 12.25 microns; the width of the decoder is approximately 20.3 mils. Response times of approximately 30 nsecs are typical for the described decoding circuit. The relatively small pitch is possible since the first and second level decoding is shared by four row lines. That is, the central portion of the decoding circuit of FIG. 3 (transistors 31, 32, 34, 35, 36 and 38) need only be repeated for every four row lines.

It will be appreciated that while four row lines are coupled to node 30, any number of row lines may be coupled to this node. For example, eight lines could be coupled to this node if three address signals are decoded by the R-decoders. Other numbers of address signals may also be employed for the first and second level of decoding.

Thus a unique decoding circuit has been disclosed which is particularly suitable for use with a high density memory.

We claim:

1. A MOS static decoding circuit comprising:
    a first decoding means for receiving first address signals and for providing a signal when said first address signals are in a predetermined state;
    a first field-effect device having a threshold voltage of approximately zero volts, one terminal of said first device adapted for coupling to a source of potential, the other terminal of said first device coupled to a common node, and the gate of said first device coupled to receive said signal from said first decoding means;
    a second decoding means coupled to said common node for receiving a plurality of second address signals; said second decoding means for permitting said node to rise in potential when said second address signals are in a predetermined state;
    said second decoding means coupled to receive the complement of said signal from said first decoding means for preventing said common node from rising in potential when said first address signals are in other than said predetermined state;
    whereby when said common node is coupled to memory cells a potential is provided to said cells when said first and second address signals are in said predetermined states.

2. The decoding circuit defined by claim 1 including a depletion mode field-effect device coupled between said other terminal of said first device and said common node.

3. An MOS static decoding circuit comprising:
    a first decoding means for receiving first address signals and for providing a signal when said first address signals are in a predetermined state;
    a first field-effect device having a threshold voltage of approximately zero volts, the gate of said first device coupled to receive said signal from said first decoding means;
    a second decoding means comprising a plurality of second field-effect devices, each of said second devices having one of its terminals coupled to a common node, said common node coupled to one terminal of said first device, the gates of said second devices coupled to receive second address signals; and,
    a third field-effect device having one of its terminals coupled to said common node and its gate coupled to receive the complement of said signal from said first decoding means;
    whereby said common node may be coupled to memory cells, or the like, for providing a potential for said cells when said first and second address signals are in predetermined states.

4. The MOS static decoding circuit defined by claim 3 including a depletion mode transistor coupled between said common node and said one terminal of said first device.

5. The MOS static decoding circuit defined by claim 3 wherein said second and third devices are enhancement mode devices.

6. The MOS static decoding circuit defined by claim 5 including a plurality of lines and third decoding means for receiving third address signals and for selectively coupling at least one of said lines to said common node.

7. The MOS static decoding circuit defined by claim 6 wherein said lines are coupled to said common node through a plurality of fourth field-effect devices each having a threshold voltage of approximately zero volts, the gates of said fourth device coupled to receive said third address signals.

8. An MOS static decoding circuit comprising:
    first decoding means for receiving first address signals and for providing a signal when said first address signals are in a predetermined state;
    a first field-effect device having a threshold voltage of approximately zero volts, one terminal of said device for coupling to a source of potential, the other terminal of said first device coupled to a common node, and the gate of said first device coupled to receive said signal from said first decoding means;
    second decoding means coupled to said common node for receiving a plurality of second address signals, said second decoding means for permitting said node to rise in potential when said second address signals are in a predetermined state;
    a plurality of lines;
    a third decoding means for receiving third address signals and for selectively coupling at least one of said lines to said common node;

whereby when said first, second and third address signals are in predetermined states a potential is applied to at least one of said lines.

9. The MOS static decoding circuit defined by claim 8 wherein said third decoding means comprises a plurality of second field-effect devices each having a threshold voltage of approximately zero units, the terminals of said second device coupled between said lines and said common node and the gates of said second devices coupled to receive said third address signals.

10. The MOS static decoding circuit defined by claim 9 including a depletion mode device coupled between said other terminal of said first device and said common node.

* * * * *

UNITED STATES PATENT AND TRADEMARK OFFICE
CERTIFICATE OF CORRECTION

PATENT NO. : 4,264,828
DATED : April 28, 1981
INVENTOR(S) : GEORGE PERLEGOS, ET AL It is certified that error appears in the above-identified patent and that said Letters Patent are hereby corrected as shown below:

| COLUMN | LINE | |
|---|---|---|
| 7 | 7 | "zero units" should be --zero volts-- |

Signed and Sealed this

Third Day of January 1984

[SEAL]

Attest:

GERALD J. MOSSINGHOFF

Attesting Officer     Commissioner of Patents and Trademarks